United States Patent [19]
Strickland

[11] Patent Number: 5,673,000
[45] Date of Patent: Sep. 30, 1997

[54] DYNAMICALLY INVARIANT AB LINEAR OPERATION AMPLIFIER

[75] Inventor: James C. Strickland, Mesa, Ariz.

[73] Assignee: Rockford Corporation, Tempe, Ariz.

[21] Appl. No.: 583,443

[22] Filed: Jan. 5, 1996

[51] Int. Cl.$^6$ .................. H03F 3/45; H03F 3/26
[52] U.S. Cl. ............................ 330/255; 330/268
[58] Field of Search ........................ 330/255, 257, 330/263, 267, 268

[56] References Cited

U.S. PATENT DOCUMENTS

| | | | |
|---|---|---|---|
| 4,274,060 | 6/1981 | Kawanabe | 330/255 X |
| 4,286,227 | 8/1981 | Sato | 330/255 |
| 4,334,197 | 6/1982 | Otao | 330/268 |

*Primary Examiner*—Steven Mottola
*Attorney, Agent, or Firm*—Warner Norcross & Judd

[57] ABSTRACT

An amplifier providing the linear output of a Class A amplifier and the expanded peak current output and efficiency of a Class AB amplifier. The amplifier includes an input amplifier, a voltage regulator network, a cascode stage, and an output amplifier. The input amplifier amplifies a signal current into two outputs. The cascode stage and the output stage each contain two paths for the amplified outputs. The voltage regulator network interconnects the two paths between the input amplifier and the cascode stage. The voltage regulator network bypasses a high percentage of the quiescent current that is normally contained in the two paths of the cascode stage and the output amplifier stage, thus improving the peak-to-quiescent current output ratio beyond the 2:1 value of traditional Class A amplifiers.

13 Claims, 2 Drawing Sheets

# DYNAMICALLY INVARIANT AB LINEAR OPERATION AMPLIFIER

BACKGROUND OF THE INVENTION

The present invention relates to electrical amplifiers, and more particularly to audio power amplifiers.

A Class A audio power amplifier includes a differential amplifier driving a transconductance stage. Class A amplifiers are typically biased, meaning that the transistors conduct (i.e. remain active) during the entire input cycle. To bias the transistors, voltages or currents are applied to the transistors in the amplifier circuit to establish the threshold operating point for each transistor. The current that results in the amplifier circuit from biasing, measured before any signal current is applied, is defined as the quiescent or idling current.

In any amplifier system, three properties determine the purposes for which the amplifier is suited: gain, linearity and efficiency. Gain is the amplification factor of the circuit. The output parameters (voltage or current) are a function of the input parameters multiplied by the gain of the amplifier. Linearity is the extent to which a linear relationship exists between the input and output parameters. The output parameters should exactly correspond to the input parameters multiplied by the gain of the circuit. Any nonlinearities introduced by the circuit will result in a distorted output signal. Finally, the efficiency of the amplifier is the ratio of the output or load power to the input or supply power. Efficiency measures how much of the input power is consumed by the circuit.

To enhance the output, one or more Class B current amplifying buffer stages can be interposed between the transconductance stage of a Class A amplifier and the output devices. A traditional Class B amplifier conducts for half of each cycle which allows for greater efficiency than the Class A amplifier. A typical Class B stage consists of two parallel transistors, one of these transistors is an N-channel type which reproduces the positive half of the cycle, while the other is a P-channel type that reproduces the negative half of the cycle. The two half-cycles are then recombined at the output to produce an amplified version of the original input wave form. However, since Class B amplifiers amplify each half of the input signal by separate transistors, any difference between the transistors result in nonlinearities that contribute to the distortion of the amplified output. Class B amplifiers are also plagued by crossover distortion that occurs as the input signal switches from positive to negative. At crossover, both transistors are off and there is a slight delay until the proper transistor begins to conduct the input signal. Crossover distortion in audio power amplifiers gives rise to unpleasant sounds.

To reduce crossover distortion, the biasing system of a Class B amplifier is adjusted so that the transistors conduct at a point somewhere between the traditional Class A and Class B amplifiers. This hybrid design is known as a Class AB amplifier. In a Class AB amplifier the two parallel transistors of the Class B amplifier are biased with a small, non-zero current. This biasing current eliminates the problem of crossover distortion because both transistors conduct when the input signal switches from positive to negative. Thus, the delay is eliminated as the transistors begin to conduct and crossover distortion is eliminated.

As would be expected, the linearity and efficiency characteristics of Class AB amplifiers fall between those of a true Class A or Class B amplifier. Designers have been reluctant to forego the linearity of Class A amplifiers in favor of the more efficient, but less linear, Class AB systems. Therefore, most audio power amplifiers include the Classic Class A amplifier topology for the driver stage.

Further expanding on the foregoing discussion, FIG. 1 illustrates a specific prior art classic Class A amplifier system. The transconductance stage includes transistors Q1 and Q2 biased by an appropriate biasing system, diodes D1 and D2, and Resistors R1, R2, R3, and R4. The transconductance stage acts as an amplifier in which the output current is a linear function of the input voltage. The complimentary bipolar output transistors Q1 and Q2 are arranged in a push/pull configuration with the output transistors Q1 and Q, biased by an appropriate biasing system. The output devices are connected to the collectors of the output transistors Q1 and Q2 with current provided to the output devices in accordance with the current flowing through the emitter junctions of the output transistors Q1 and Q2 as controlled by the signal from the differential amplifier stage.

The differential amplifier stage consists of transistors Q3 and Q4, resistors R5 and R6, and a current mirror M. The signal to be amplified is received at the base of either Q3 or Q4 which then induces a signal current in the corresponding output path from the differential amplifier to the transconductance stage. The two paths from the differential amplifier to the transconductance devices are developed and processed independently and linearly. This arrangement results in a Class A amplifier with very good linearity, but with low efficiency. Class A amplifiers are typically biased such that the transistors conduct during the entire input cycle which results in the low efficiency because most of the power is consumed by the circuit. Additionally, these Class A audio amplifiers are typically limited to a 2:1 peak-to-quiescent current amplification-that is, the output current is limited to a factor of two times the idling current present in the circuit. This output current is inadequate to drive the desired output devices.

Minimizing the number of stages in the signal path usually results in significant improvements in the stability of the amplifier and the resulting quality of the output. However, as shown in FIG. 2, the Class A audio power amplifier design of FIG. 1 can be modified by the addition of Q5, Q6, and Q7 in a common-base or cascode configuration. Q5 and Q7 are N-channel type bipolar junction transistors where the bases are established at ±½ of the supply voltage, respectfully. Q6 is a P-channel type bipolar junction transistor with its base set to +½ of the supply voltage. As is known in the art, the cascode configuration results in greater stability due to the increased frequency response resulting from a reduction of Miller-effect capacitances.

A significant gain in the short-loop design art has been possible due to the use of power metal-oxide semiconductor field effect transistor (MOSFET) output stages. These stages can be driven directly from an appropriate transconductance stage. To date, these bufferless designs have been effected by increasing the power level of the Class A transconductance stage; however, this process quickly becomes unwieldy due to the resulting heat and related effects that occur in the individual components. Even with these difficulties associated with the traditional audio power amplifiers, and as noted above, designers have been reluctant to forego the high quality sound reproduction capability of the highly linear Class A transconductance systems in favor of a more efficient, Class AB system.

SUMMARY OF THE INVENTION

The aforementioned problems are overcome by the present invention which provides a voltage regulator network and a current steering system between the differential amplifier and the transconductance stage to create two signal paths that are recombined at the output. Each signal path between the amplifier and the transconductance stage is interactive and nonlinear. The recombination of the two paths produces the highly linear output signal of traditional Class A amplifiers. Consequently, the invention retains the linearity of a Class A system while providing the power characteristics of a Class AB system.

In sharp contrast to the inclusion of a cascode stage, the present invention interconnects the two normally independent amplifier paths. The voltage regulator network regulates the voltages and currents propagating from the differential input stage into each path of the basic transconductance stage.

A portion of the input signal is bypassed by the voltage regulator network, resulting in a decreased quiescent current at the cascode stage. Consequently, the peak-to-quiescent current capability of this stage is dramatically increased, resulting in improved amplification and power capabilities.

The two paths are made interactive and nonlinear in a manner which always recombines to the highly linear output characteristics of a Class A system yet has the significantly expanded peak current output and efficiency of a Class AB system. The voltage regulator network current system directs the proper portion of the signal current to each transistor of the cascode stage making them interactive. This results in a continuous and uniformly synchronized output with significantly decreased distortion and reduced high-level harmonic generation.

These and other objects, advantages, and features of the invention will be more readily understood and appreciated by reference to the detailed description of the preferred embodiment and the drawings.

DETAILED DESCRIPTION OF THE PREFERRED EMBODIMENT

Figure 3:
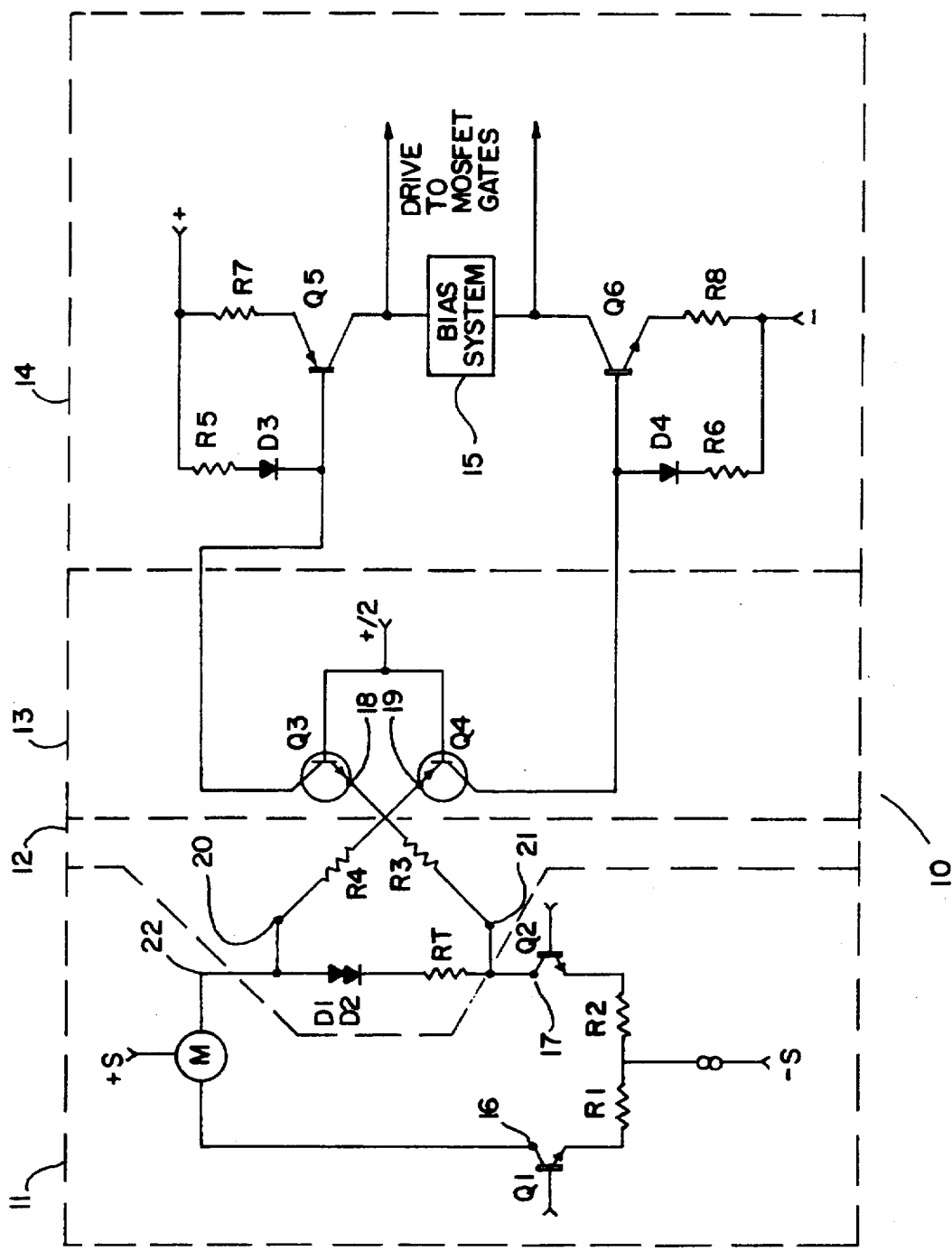
FIG. 3 is a circuit diagram of the present invention.

An amplifier topology in accordance with a preferred embodiment of the present invention is illustrated in FIG. 3 and generally designated 10. As illustrated, the amplifier topology includes a differential input stage 11, a voltage regulator network 12, a cascode stage 13, and a transconductance output stage 14.

The differential amplifier stage 11 includes a conventional current source S, two NPN type bipolar junction transistors Q1 and Q2, emitter resistors R1 and R2, and a current mirror M. The conventional current source provides equivalent quiescent currents at the collectors 16 and 17 of Q1 and Q2. The high impedance outputs of Q2 and the current mirror M cooperate to form a single-ended, push-pull, current-output stage from the differential amplifier stage 11. The current minor M presents an equivalent output to balance the quiescent current of Q2.

Various types of transistors including metal-oxide semiconductor field effect transistors (MOSFETs) or junction field effect transistors (J-FETs) may be substituted without affecting the performance of the current invention.

The voltage regulator network 12 includes diodes D1 and D2 and trimming resistor Rt is provided to bypass a high percentage of the quiescent current developed at the collector 17 of Q2, and at the output 22 of the current mirror M.

The common base or cascode stage 13 includes transistors Q3 (N-channel type) and Q4 (P-channel type) and resistors R3 and R4. The stage connects the differential amplifier stage 12 with the basic transconductance output system 14. The output current from the current mirror M biases the voltage regulator network and provides quiescent and signal currents to the cascode stage 13.

The trimming resistor Rt of the voltage regulator network 12 permits the emitter resistors R3 and R4 to be raised or lowered to optimize system bias, current headroom, thermal and device-variation stability, as well as normal linear cascode properties.

The transconductance output stage 14 includes complementary bipolar output transistors Q5 (PNP) and Q6 (NPN) in a push/pull configuration with the output transistors Q5 and Q6 biased by an appropriate biasing system 15. Diodes D3 and D4 and resistors R5, R6, R7 and R8 complete the transconductance stage, and the proportional values of these resistors are chosen to establish the gain for this stage.

Operation

In stark contrast to a Class A amplifier, the peak-to-quiescent current-output ratio of the present invention is significantly higher than the 2:1 value of Class A connectivity. The voltage regulator network 12 bypasses a high percentage of the quiescent current developed in Q2 and the current mirror M around Q3 and Q4. This leaves the cascode stage 13 with a greatly reduced quiescent current. Since peak current capability remains unchanged, reducing the quiescent term propagation into Q3 and Q4 greatly improves their peak-to-quiescent current capability. This results in a significant improvement in the overall amplification and power capabilities of the present invention.

The invariant transconductance properties of the present invention result from the constant sum of the signal current fractions contained in the cascode stage 13. The output stage transistors Q5 and Q6 provide full transconductance contribution down to nearly zero current propagation through each branch of the output transconductance system 14. Once zero current propagation is reached in the path containing either Q5 or Q6, the other path must provide all of the transconductance supplied equally by Q5 and Q6 at the quiescent point.

Figure 1:
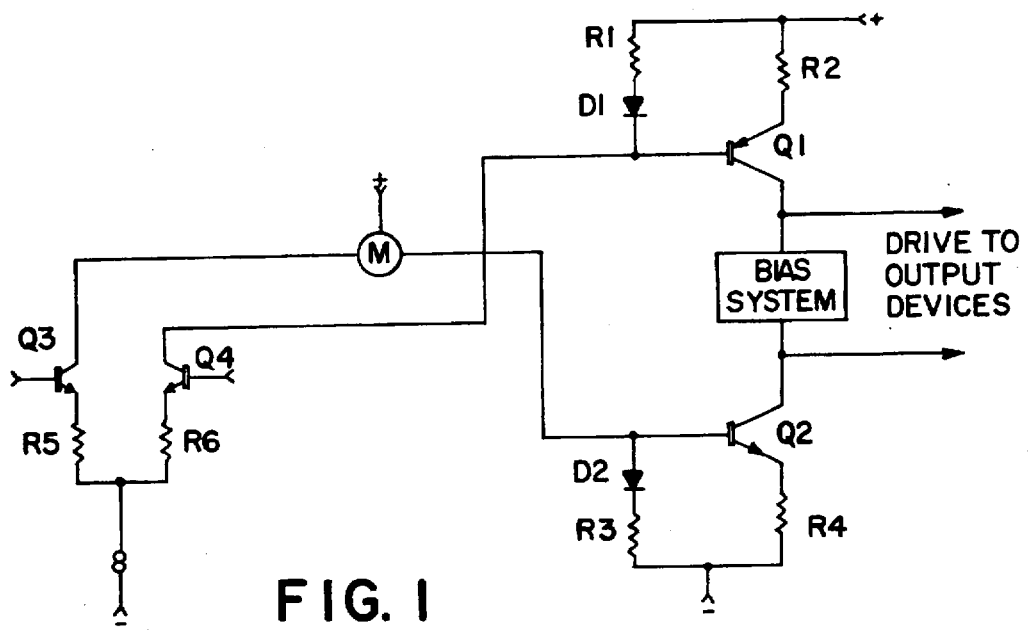
FIG. 1 is a circuit diagram of a prior art Class A amplifier topology.
Figure 2:
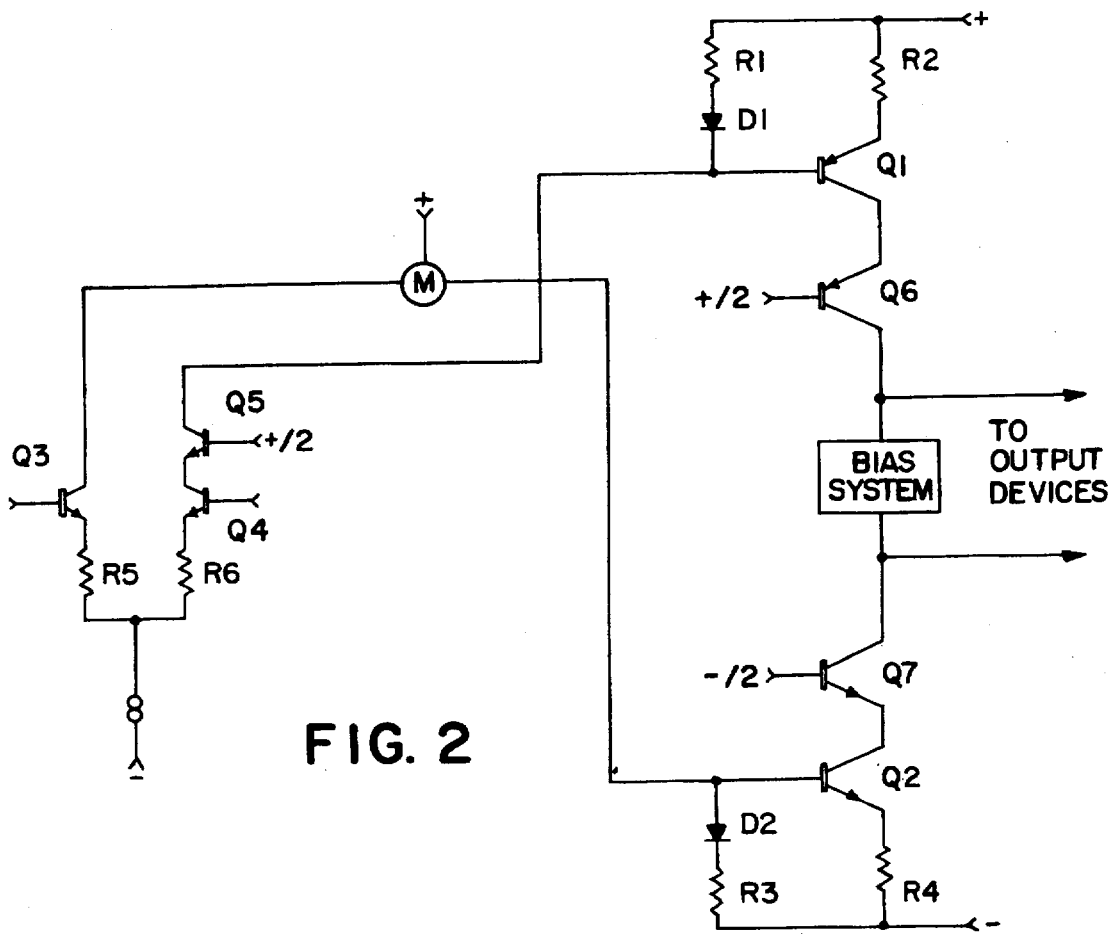
FIG. 2 is a circuit diagram of a prior art Class A amplifier topology including a common base or cascode stage.

In the prior art amplifier of FIG. 2, if either of the output transconductance stage transistors Q3 or Q4 were driven linearly to effectively zero current, the output signal would experience significant crossover distortion common in traditional audio amplifiers. This results from the delay associated when either Q3 or Q4 begins to conduct current through its respective path. In order to avoid the resulting distortion that occurs if either Q3 or Q4 were driven linearly to zero current, a relatively smooth and continuous transfer function is required for transferring the transconductance function from one output system path to the other.

In accordance with the present invention, any signal current propagated into the differential amplifier stage 11 is represented as the difference in the current flowing from the output of the current mirror M and the current flowing into the collector 17 of Q2. This signal current is then steered into the cascode stage 13—specifically into the emitters 18 and 19 of Q3 and Q4. The fractional signal current contained in Q3 and Q4 always maintains a constant sum, regardless of the proportion of the signal current carried independently by Q3 or Q4.

The percentage of signal current propagating in each path of the cascode stage 13 and the output transconductance system 14 is determined by the dynamic emitter resistance of the interconnected pair Q3 and Q4. The dynamic emitter resistance of each bipolar transistor Q3 and Q4 varies inversely with the instant total current in each path following the classical exponential transconductance relationship di/dV=ki.

The signal current develops a small AC voltage common to the entire voltage regulator network 12. This small AC voltage causes fractions of the signal current into the cascode stage 13 to be inversely proportional to the sum of the fixed emitter resistors R3 and R4 and the dynamic emitter resistance of the cascode stage transistors Q3 and Q4. Thus, as signal current is generated by the output of the current mirror M and Q2, one emitter path resistance of the cascode stage is decreased and the other increased. As this happens, the signal current is steered progressively into the path of decreasing resistance and away from the path of increasing resistance—the two fractions however always maintaining a constant sum equal to the signal current.

As the proportion of current flowing through one transistor Q3 or Q4 increases, the left end 20 or 21 of its corresponding emitter resistor R3 or R4 will decrease in potential. As this occurs, the regulator network pulls down the left end 20 or 21 of the other emitter resistor by a similar amount. This results in the corresponding emitter 18 or 19 of either Q3 or Q4 decreasing in voltage and reducing the current below the quiescent value. By reducing the current flowing through this path, the associated voltage drop across the emitter resistor R3 or R4 contained in the path will also be decreased. At this time, the dynamic emitter resistance of either Q3 or Q4 is much greater in one path than the other. This results in one path of the cascode stage 13 containing either Q3 or Q4 to be carrying a greater fraction of the signal current than the other path. As more of the signal current is drawn from the emitter 18 or 19 of the path propagating the increased proportion of the signal current, that path approaches propagation of 100% of the signal current.

Due to the circuit symmetry, identical operation occurs on the opposite phase of the signal current, with the opposite path approaching conducting 100% of the signal current. However, the present invention never operates as a true Class B amplifier because the transistors Q3 and Q4 in the cascode stage 13 and the transistors Q5 and Q6 in the output transconductance stage 14 never reach cutoff. This eliminates the crossover distortion common to Class B amplifiers as one transistor moves from near cutoff to operation. The voltage regulator network 12 provides the excess current needed to drive the transistors Q3 and Q4 of the cascode stage 13 as the percentage of signal current carried by either transistor Q3 or Q4 increases from near zero.

The above description is that of a preferred embodiment of the invention. Various alterations and changes can be made without departing from the spirit and broader aspects of the invention as defined in the appended claims, which are to be interpreted in accordance with the principles of patent law including the doctrine of equivalents.

The embodiments of the invention in which an exclusive property or privilege is claimed are defined as follows:

1. An amplifier for amplifying an electrical signal comprising:

input amplifier means for amplifying an input signal to produce a first amplified signal;

cascode means for converting the first amplified signal into a second bipolar amplified signal, said cascode means including a pair of transistors;

bipolar output amplifier means for amplifying the second bipolar amplified signal, said output amplifier means including two power transistors each driven by one of said cascode transistors; and current steering means between said input amplifier means and said cascode means for steering two equal complimentary portions of the current produced by said input amplifier means to said cascode means, each of the complimentary portions going to one of said cascode transistors.

2. An amplifier as defined in claim 1 wherein said current steering means includes a diode connected between signal paths for the complementary current portions, said diode bypassing a majority of the current produced by said input amplifier means.

3. An amplifier as defined in claim 2 wherein said voltage regulator means includes a trimming resistor connected in series with said diode and in parallel with said signal paths, whereby said trimming resistor can be adjusted to adjust system bias, current headroom, and thermal and device variation stability.

4. An amplifier as defined in claim 1 wherein said input amplifier means includes a differential amplifier.

5. An amplifier as defined in claim 4 wherein said differential amplifier includes a current mirror.

6. An amplifier as defined in claim 1 wherein said output amplifier means includes a transconductance amplifier.

7. An amplifier as defined in claim 6 wherein said transconductance amplifier includes complementary bipolar output transistors in a push/pull configuration.

8. An amplifier for amplifying an electrical signal comprising:

input amplification means for amplifying an input signal to produce a first amplified signal;

cascode means for converting the first amplified signal into a second bipolar amplified signal, said cascode means including a pair of cascode transistors;

current steering means connected between said input amplification means and said cascode means for steering two equal complimentary portions of the current produced by said input amplification means to said cascode means, each of the complimentary portions going to one of said cascode transistors; and output amplification means for amplifying the second bipolar amplified signal, said output amplifier means including two power transistors each driven by one of said cascode transistors.

9. An amplifier as defined in claim 8 wherein said current steering means includes a diode connected in parallel with signal paths for the complimentary current portions, said diode bypassing a majority of the current produced by said input amplification means.

10. An amplifier as defined in claim 9 wherein said voltage regulator means further includes a trimming resistor connected in parallel with said two signal paths, said trimming resistor permitting adjustment of system bias, current headroom, and thermal and device variation stability.

11. An amplifier as defined in claim 8 wherein said input amplification means includes a differential amplifier.

12. An amplifier as defined in claim 11 wherein said differential amplifier includes a current mirror.

13. An amplifier as defined in claim 8 wherein said output amplification means includes a transconductance amplifier.

* * * * *